United States Patent [19]
Ravanelli

[11] Patent Number: 6,147,852
[45] Date of Patent: Nov. 14, 2000

[54] DEVICE FOR PROTECTING AN INTEGRATED CIRCUIT AGAINST ELECTROSTATIC DISCHARGES

[75] Inventor: Enrico M. A. Ravanelli, Monza, Italy

[73] Assignee: STMicroelectronics S.r.l., Agrate Brianza, Italy

[21] Appl. No.: 09/159,315

[22] Filed: Sep. 23, 1998

[30] Foreign Application Priority Data

Sep. 23, 1997 [EP] European Pat. Off. .............. 97830463

[51] Int. Cl.[7] ..................................................... H02H 9/00
[52] U.S. Cl. ............................... 361/111; 361/56; 361/58; 361/91.1
[58] Field of Search ................................. 361/18, 56, 58, 361/91.1, 111, 113, 115, 118

[56] References Cited

U.S. PATENT DOCUMENTS

| | | | |
|---|---|---|---|
| 5,086,365 | 2/1992 | Lien | 361/58 |
| 5,539,327 | 7/1996 | Shigehara et al. | 361/56 |

FOREIGN PATENT DOCUMENTS 0 387 798  9/1990  European Pat. Off.  ......... H02H 9/04

OTHER PUBLICATIONS

European Patent Abstract of Japanese publication No. 59123256, published Jul. 17, 1984.

European Search Report dated Feb. 18, 1998 with annex on European Application No. 97 830463.

*Primary Examiner*—Stephen W. Jackson
*Attorney, Agent, or Firm*—Theodore E. Galanthay; Stephen C. Bongini; Fleit, Kain, Gibbons, Gutman & Bongini P.L.

[57] ABSTRACT

An electrostatic discharge protection circuit for integration into an integrated circuit device. The protection circuit includes at least one transistor having a first terminal connected to an input or output terminal of the integrated circuit device, a second terminal connected to a supply line for the integrated circuit device, and a control terminal connected to ground. In a preferred embodiment, the transistor is formed by a structure that includes a substrate of a first conductivity type, a first region of a second conductivity type, a second region of the first conductivity type, a third region of the first conductivity type, and a fourth region of the second conductivity type. The third region has greater conductivity than the substrate and the fourth region has greater conductivity than the first region. These regions are formed such that the first region extends from a surface of the substrate, the second region extends from the surface into a portion of the first region, and the third region has one portion buried beneath the first region and another portion extending to the surface. Additionally, the fourth region extends from the second region with a ring shape so as to form a bipolar junction with the second region in an area beneath a non-peripheral portion of the second region.

8 Claims, 4 Drawing Sheets

DEVICE FOR PROTECTING AN INTEGRATED CIRCUIT AGAINST ELECTROSTATIC DISCHARGES

CROSS-REFERENCE TO RELATED APPLICATIONS

This application is based upon and claims priority from prior European Patent Application No. 97-830463.2, filed Sep. 23, 1997, the entire disclosure of which is herein incorporated by reference.

BACKGROUND OF THE INVENTION

1. Field of the Invention

The present invention relates to circuits for protecting integrated circuit devices from electrostatic discharges, and more specifically to protection circuits of compact size for mixed technology integrated circuit devices that operate with low supply voltages.

2. Description of Related Art

The contact pads of an integrated circuit device can inadvertently come into contact with electrically charged objects during fabrication, assembly to a host circuit, or operation. Such contact can create electric potential differences between different areas of the integrated circuit that are of sufficient magnitude to damage or even destroy thin dielectrics (e.g., gate oxides of MOS transistors) in the device. In other words, if the potential difference caused by electrostatic discharges (ESDs) exceeds the dielectric strength of the gate insulation, there will be a break down of the gate insulation and the associated MOS transistor will become unusable. For example, such destructive effects can occur in a CMOS integrated circuit device with a minimum gate size of 1.2 $\mu$m at voltages in the 12V range, which is much lower than the voltages that can be produced by ESDs. Further, avalanche reverse conduction phenomena can set in and cause the junctions to break down.

There are various conventional ways for protecting the input and output terminals of an integrated circuit device against electrostatic discharges. For example, some circuits typically used to protect input terminals employ resistors in series or diodes in series or in parallel that are integrated to the substrate of the integrated circuit itself in order to limit the currents caused by ESDs. More complex circuits for protecting input or output terminals from ESDs utilize a thyristor structure or siliconcontrolled rectifiers (SCRs) with modifications to lower the triggering voltage of the device.

FIG. 1 shows an input protection circuit for a BiCMOS type device (i.e., a mixed technology integrated circuit device). Two transistors Q1 and Q2 are arranged so as to form a structure that is equivalent to a Zener diode connected between the input terminal IN and ground GND. Such an ESD protection circuit and its operation are described in the book "BiCMOS Technology and Applications," Second Edition, by A. R. Alvarez, Cypress Semiconductor Corporation of San Jose, California. The circuit of FIG. 1 provides a highly compact protection circuit that can readily be integrated in a BiCMOS type process and that is quite effective in integrated circuit devices having a protection circuit for each ESD sensitive terminal.

However, for devices integrated using mixed-type (e.g., BiCMOS) processes in which an epitaxial layer is grown on the surface of a monocrystalline silicon substrate, ESD protection circuits can interfere with proper circuit operation if the epitaxial wells of the protectors are directly connected to the protected terminals. In particular, during an electrostatic discharge, the directly connected epitaxial wells can act as parasitic collectors for substrate currents (i.e., a parasitic NPN transistor is activated in the event of a ground loop) so as to cause a latch-up, which is a regenerative phenomenon with destructive consequences that is caused by parasitic bipolar structures of the SCR type. Additionally, the parasitic well capacitance can produce an antenna effect and switching type disturbance that alters the functionality of the circuit coupled to the protected terminal.

SUMMARY OF THE INVENTION

In view of these drawbacks, it is an object of the present invention to remove the above-mentioned drawbacks and to provide an ESD protection circuit for mixed technology epitaxial layer integrated circuit devices that prevents latch-up and electromagnetic interference. The protection circuit is formed such that the collector of a transistor is directly connected to the power supply and the emitter is connected to a terminal of the integrated circuit device. This will cause any incoming disturbance to be "diverted" to the power supply, so the terminal is effectively screened from outside disturbances. Further, such a protection circuit does not cause latch-up problems.

An embodiment of the present invention provides an electrostatic discharge protection circuit for integration into an integrated circuit device. The protection circuit includes at least one transistor having a first terminal connected to an input or output terminal of the integrated circuit device, a second terminal connected to a supply line for the integrated circuit device, and a control terminal connected to ground. In a preferred embodiment, the transistor is formed by a structure that includes a substrate of a first conductivity type, a first region of a second conductivity type, a second region of the first conductivity type, a third region of the first conductivity type, and a fourth region of the second conductivity type. The third region has greater conductivity than the substrate and the fourth region has greater conductivity than the first region. These regions are formed such that the first region extends from a surface of the substrate, the second region extends from the surface into a portion of the first region, and the third region has one portion buried beneath the first region and another portion extending to the surface. Additionally, the fourth region extends from the second region with a ring shape so as to form a bipolar junction with the second region in an area beneath a non-peripheral portion of the second region.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
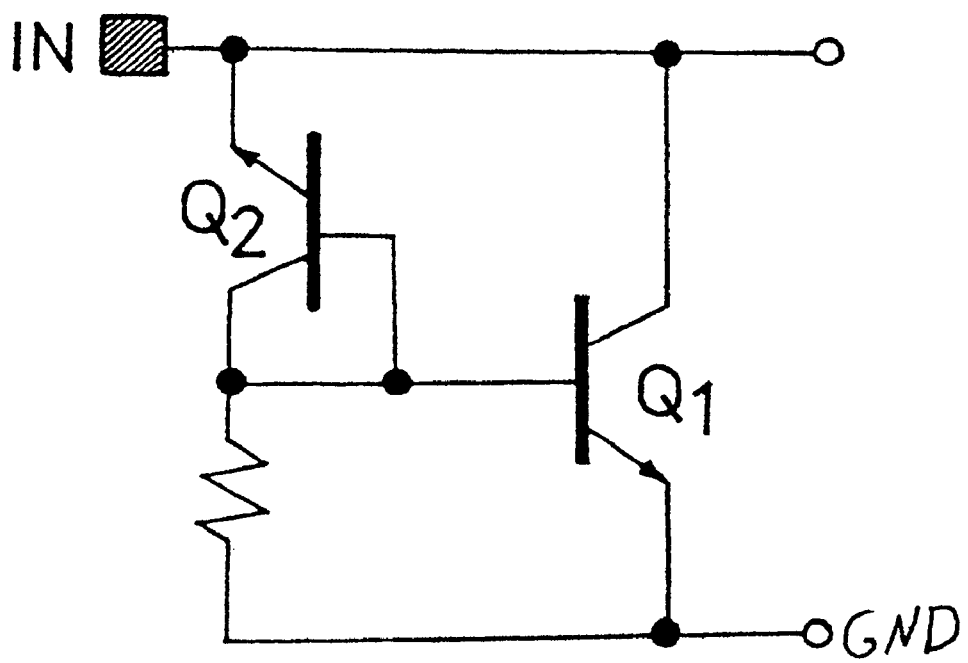
FIG. 1 is a circuit diagram showing a conventional protection circuit.
Figure 2:
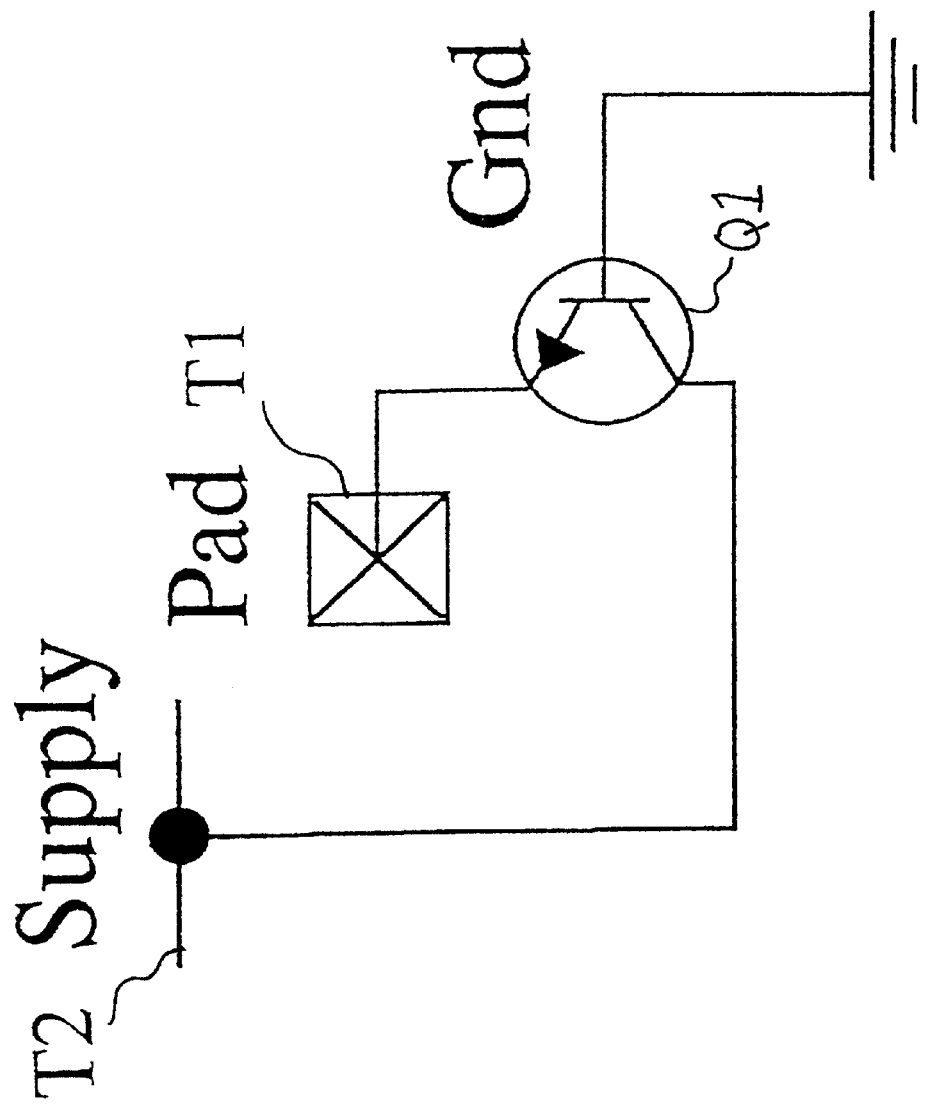
FIG. 2 is a circuit diagram showing an ESD protection circuit according to a preferred embodiment of the present invention.

FIG. 2 shows an electrostatic discharge (ESD) protection circuit according to a preferred embodiment of the present invention. The protection circuit can be used to provide ESD protection for the input and output terminals of an integrated circuit device of the type having an epitaxial layer, and will not cause latch-up or electromagnetic interference problems. As shown, an NPN bipolar transistor Q1 is connected between a supply line T2 and a terminal (or pad) T1 that is to be protected. More specifically, the emitter is connected to the terminal T1, the collector is connected to the supply line T2, and the base is connected to ground GND. In the preferred embodiment, the supply line is the main supply line for the integrated circuit device.

During operation, the pad is screened from any outside disturbances because the transistor collector, and thus the epitaxial well of the protection circuit itself, is directly connected to the power supply. That is, any incoming disturbance is "diverted" to the power supply. Further, a protection circuit constructed in this way is immune to latch-up problems. Thus, the protection circuit of the present invention is unaffected by parasitic disturbances that could alter the functionality of the circuit coupled to the terminal. For proper operation, the transistor must be designed so that the emitter-base junction is not degraded by the electrostatic discharge if forced into breakdown.

Figure 3:
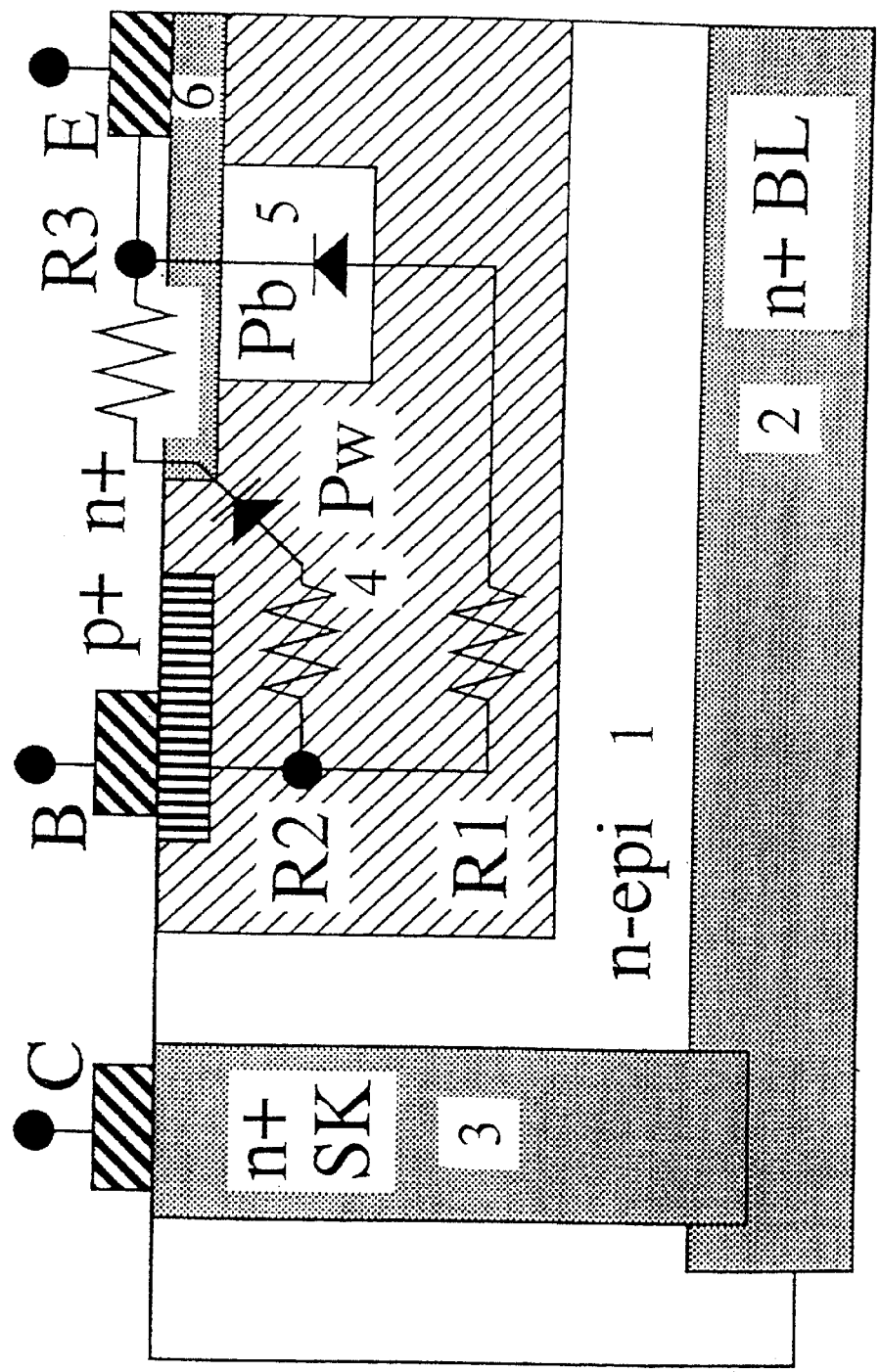
FIG. 3 is a cross-sectional view showing an essential portion of an ESD protection circuit according to an embodiment of the present invention.

FIG. 3 shows a cross-section of one embodiment of the protection circuit of the present invention. An epitaxial layer 1, which is doped with N-type impurities, has a thickness of 8 to 10 $\mu$m, and resistivity in the 1.5 Ohm*cm range, is grown over a monocrystalline silicon die consisting of a substrate doped with P-type impurities (not shown). During the growing of the epitaxial layer 1 by a conventional technique, a buried layer 2 is formed that is more heavily doped ($N^+$) than the rest of the layer.

The buried layer 2 is connected to the surface by a sinker region 3, which is also of the $N^+$-type. A surface region having two P-type regions 4 and 5 is formed over the buried layer 2.

In particular, the P-well region 4 is formed by boron implantation at an implant dosage of $8 \times 10^2$ cm$^2$ to $1.2 \times 10^{13}$ cm$^{-2}$ and to a junction depth of about 3.5 $\mu$m, and the P-body region 5 is formed in the P-well region 4 at a higher impurity concentration by boron implantation at a dosage of $1 \times 10^{13}$ cm$^{-2}$ to $3 \times 10^{13}$ cm$^{-2}$ and to a depth of about 1.25 $\mu$m. Additionally, an N-type region 6 that extends through the P-body region from the top surface of the die is formed by arsenic implantation at a dosage of approximately $1 \times 10^{15}$ cm$^{-2}$ and to a junction depth of about 1 $\mu$m. Electrical connections B, C, and E, which consist of diffused regions of the $P^+$ or $N^+$ types and paths of a conductive material such as aluminum or doped polycrystalline silicon (e.g., pads), are formed in the regions 4, 3, and 6 (respectively) so as to provide ohmic contact to these regions. With such a structure, the protection circuit of FIG. 2 can be fabricated in a simple manner.

The transistor Q1 of the protection circuit is formed by the NPN succession of regions 6, 5, 4, and 2, with the $N^+$ region 6 being the emitter, the P-body and P-well regions 5 and 4 being the base, and the epitaxial layer 1 including the buried layer 2 being the collector. The cross-section shown in FIG. 3 depicts only an essential portion of the overall protection circuit that is derived from a conventional P-well buried base transistor. The remaining portion of the circuit, which is omitted for simplicity, is quite symmetrical about the emitter pad.

The ESD protection circuit of the present invention includes an additional ring-shaped P-body diffusion region 5 that is fully enclosed within the base diffusion region 4. Further, the $N^+$ emitter diffusion region 6 occupies an area that is broader throughout than the ring-shaped P-body region, and thus completely overlays the P-body region. The emitter pad is formed in an area of the $N^+$ diffusion region 6 that overlies the ring-shaped P-body region 5.

Because the P-body diffusion region lies fully beneath the $N^+$ emitter region, a flat buried junction area is provided as an area for possible avalanche conduction for the emitter-base junction. This raises the failure threshold with respect to transistors in which the avalanche conduction is triggered at the surface and lateral junction between the $N^+$ emitter region and the P-well region. Furthermore, the likelihood of avalanche conduction being triggered between the emitter region and the P-well region is further diminished because the emitter pad is placed in an area opposite from the base pad with respect to the P-body diffusion region. Thus, the protection circuit of the present invention can provide enhanced ESD strength.

Figure 4:
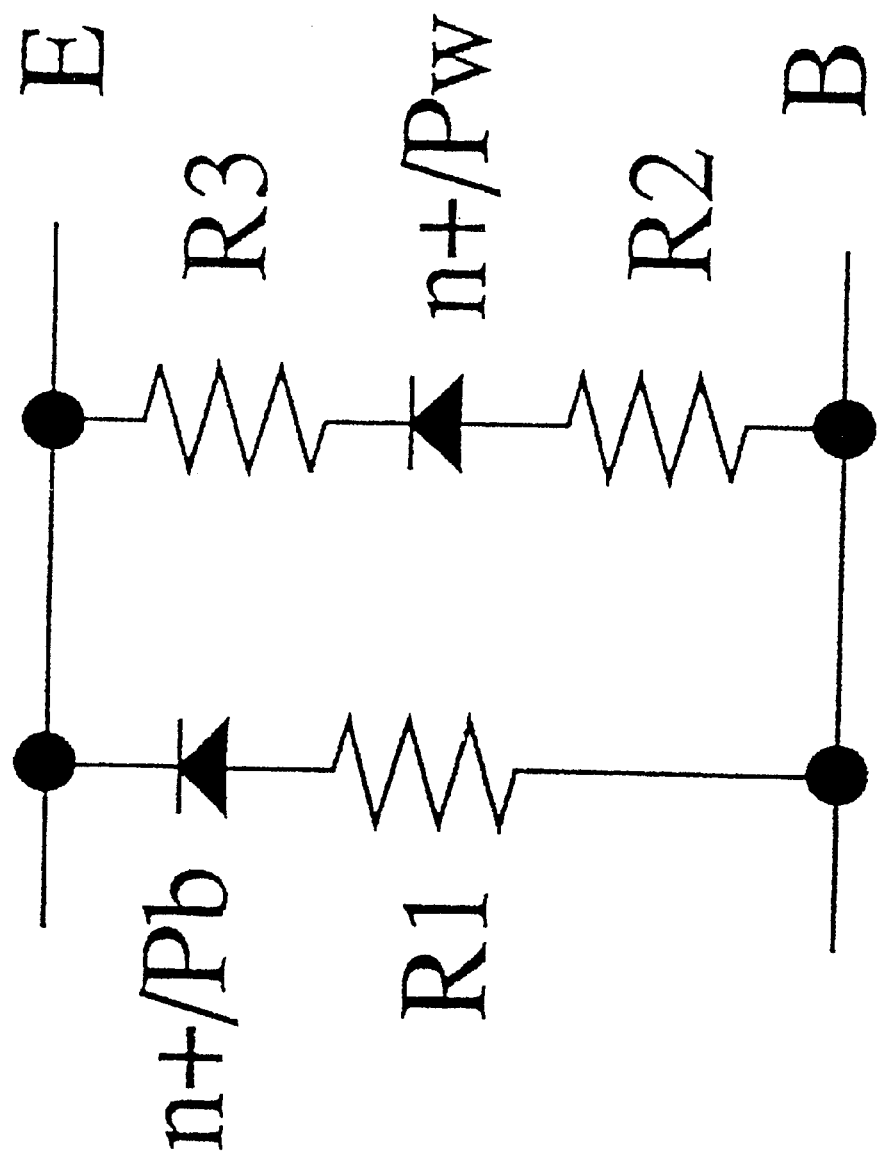
FIG. 4 is a circuit diagram showing the equivalent circuit for the emitter-base junction of the NPN transistor of the protection circuit.

FIG. 4 shows an equivalent circuit for the emitter-base junction of the transistor of FIG. 3. The transistor operates as described above because the current path through the emitter and P-well junction is disfavored due to the presence of resistor R3.

While the embodiments described above relate to mixed technology integrated circuit devices, applications of the protection circuit of the present invention are not limited to only such devices.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. An electrostatic discharge protection circuit for monolithic integration into an integrated circuit device with at least one input terminal and at least one output terminal. said protection circuit comprising:

at least one transistor having a first terminal. a second terminal. and a control terminal. the first terminal of the transistor being connected to the input terminal or the output terminal. the second terminal of the transistor being connected to a supply line for the integrated circuit device. and the control terminal of the transistor being connected to ground, wherein the transistor is formed by a structure comprising:

a substrate of a first conductivity type;

a first region of a second conductivity type, which is opposite the first conductivity type, that extends from a surface of the substrate;

a second region of the first conductivity type that extends from the surface into a portion of the first region;

a third region of the first conductivity type, the third region having greater conductivity than the substrate and having a portion buried beneath the first region and another portion extending to the surface, the entire third region being isolated from the first region; and a fourth region of the second conductivity type, the fourth region having greater conductivity than the first region and extending from the second region with a ring shape so as to form a bipolar junction with the second region in an area beneath a non-peripheral portion of the second region.

2. The protection circuit as defined in claim 1, wherein the transistor is an NPN transistor, the first terminal is the emitter, the second terminal is the collector, and the control terminal is the base.

3. The protection circuit as defined in claim 1, wherein the structure further comprises:

a base pad that is defined in a portion of the first region that is not covered by the second region;

an emitter pad that is defined in a portion of the second region that overlies the fourth region; and a collector pad that is defined in the portion of the third region that extends to the surface.

4. A semiconductor device comprising:

an integrated circuit having an external connection terminal; and an electrostatic discharge protection circuit that includes a transistor having a first terminal connected to the external connection terminal, a second terminal connected to a supply line for the integrated circuit and a control terminal connected to ground, wherein the transistor is formed by a structure comprising:

a substrate of a semiconductor material of a first conductivity type;

a first region of a second conductivity type, which is opposite the first conductivity type, that extends from a surface of the substrate;

a second region of the first conductivity type that extends from the surface into a portion of the first region;

a third region of the first conductivity type, the third region having greater conductivity than the substrate and having a portion buried beneath the first region and another portion extending to the surface, the entire third region being isolated from the first region; and a fourth region of the second conductivity type, the fourth region having greater conductivity than the first region and extending from the second region with a ring shape so as to form a bipolar junction with the second region in an area beneath a non-peripheral portion of the second region.

5. The semiconductor device as defined in claim 4, wherein the transistor is an NPN transistor, the first terminal is the emitter, the second terminal is the collector, and the control terminal is the base.

6. The protection circuit as defined in claim 4, wherein the structure further comprises:

a base pad that is defined in a portion of the first region that is not covered by the second region;

an emitter pad that is defined in a portion of the second region that overlies the fourth region; and a collector pad that is defined in the portion of the third region that extends to the surface.

7. A transistor structure for protecting a terminal of an integrated circuit device from electrostatic discharges, said structure comprising:

a substrate of a first conductivity type;

a first region of a second conductivity type, which is opposite the first conductivity type, that extends from a surface of the substrate;

a second region of the first conductivity type that extends from the surface into a portion of the first region;

a third region of the first conductivity type, the third region having greater conductivity than the substrate and having a portion buried beneath the first region and another portion extending to the surface, the entire third region being isolated from the first region; and a fourth region of the second conductivity type, the fourth region having greater conductivity than the first region and extending from the second region with a ring shape so as to form a bipolar junction with the second region in an area beneath a non-peripheral portion of the second region.

8. The structure as defined in claim 7, wherein a base pad is defined in a portion of the first region that is not covered by the second region, an emitter pad is defined in a portion of the second region that overlies the fourth region, and a collector pad is defined in the portion of the third region that extends to the surface.

* * * * *

UNITED STATES PATENT AND TRADEMARK OFFICE
CERTIFICATE OF CORRECTION

PATENT NO : 6,147,852
DATED : November 14, 2000
INVENTOR(S): Enrico M. A. Ravanelli It is certified that error appears in the above-identified patent and that said Letters Patent are hereby corrected as shown below:

Under Foreign Application Priority Data, please change "97830463" to --97830463.2--.

Signed and Sealed this

First Day of May, 2001

*Attest:*

NICHOLAS P. GODICI

*Attesting Officer*   *Acting Director of the United States Patent and Trademark Office*